US010564191B2

(12) United States Patent
Novak et al.

(10) Patent No.: US 10,564,191 B2
(45) Date of Patent: Feb. 18, 2020

(54) TEST TOOL FOR POWER DISTRIBUTION NETWORKS

(71) Applicant: Oracle International Corporation, Redwood Shores, CA (US)

(72) Inventors: Istvan Novak, Bedford, MA (US); Peter J. Pupalaikis, Ramsey, NJ (US)

(73) Assignee: Oracle International Corporation, Redwood Shores, CA (US)

( * ) Notice: Subject to any disclaimer, the term of this patent is extended or adjusted under 35 U.S.C. 154(b) by 158 days.

(21) Appl. No.: 15/721,151

(22) Filed: Sep. 29, 2017

(65) Prior Publication Data

US 2018/0143227 A1    May 24, 2018

Related U.S. Application Data

(60) Provisional application No. 62/425,366, filed on Nov. 22, 2016, provisional application No. 62/452,828, filed on Jan. 31, 2017.

(51) Int. Cl.
*G01R 19/25* (2006.01)
*G01R 31/08* (2006.01)
(Continued)

(52) U.S. Cl.
CPC ......... *G01R 19/2513* (2013.01); *G01R 13/20* (2013.01); *G01R 19/0092* (2013.01);
(Continued)

(58) Field of Classification Search
CPC ............ G01R 19/2513; G01R 19/0092; G01R 19/2509; G01R 31/086; G01R 31/40; G01R 13/20
See application file for complete search history.

(56) References Cited

U.S. PATENT DOCUMENTS 5,311,116 A    5/1994 Rogers
8,289,037 B2    10/2012 Labib et al.
(Continued)

OTHER PUBLICATIONS

Steve Sandler, Heidi Barnes, "Introduction to Power Integrity," DesignCon 2016, Jan. 19-21, 2016, Santa Clara, CA.
(Continued)

*Primary Examiner* — Bryan Bui
(74) *Attorney, Agent, or Firm* — Invoke

(57) ABSTRACT

Methodologies and systems are described herein whereby performance parameters of a power converter may be tested. In one or more embodiments, a system for testing the performance parameters comprises a multi-channel monitoring device including a first channel for monitoring a switch voltage of a power converter and a second channel for concurrently monitoring an output voltage of the power converter. The system further comprises a set of one or more processors for generating, as a function of the switch voltage and the output voltage, and displaying an inductor current waveform approximating current through an inductor of the power converter. Additionally or alternatively, other waveforms such as output current waveforms and inductor voltage waveforms, may be generated during testing of the power converter. An arbitrary wave generator may inject different signals during testing of the power converter.

20 Claims, 12 Drawing Sheets

(51) Int. Cl.
*G01R 19/00* (2006.01)
*G01R 13/20* (2006.01)
*G01R 31/40* (2014.01)

(52) U.S. Cl.
CPC ....... *G01R 19/2509* (2013.01); *G01R 31/086* (2013.01); *G01R 31/40* (2013.01)

(56) References Cited

U.S. PATENT DOCUMENTS

| | | |
|---|---|---|
| 8,854,026 B2 | 10/2014 | Karlsson et al. |
| 2007/0274015 A1 | 11/2007 | Isham |
| 2009/0146643 A1 | 6/2009 | Ostrom et al. |
| 2009/0222234 A1 | 9/2009 | Dmitriev-Zdorov |
| 2010/0213897 A1* | 8/2010 | Tse ................. H02J 7/0013 320/116 |
| 2012/0139518 A1 | 6/2012 | Cleveland et al. |
| 2012/0194161 A1 | 8/2012 | Latham et al. |
| 2013/0147452 A1* | 6/2013 | Yang .................. G05F 1/44 323/282 |
| 2016/0111958 A1* | 4/2016 | Choi ................. H02M 3/158 327/540 |

OTHER PUBLICATIONS

Radhakrishnan, et al, "Optimization of Package Power Delivery and Power Removal Solutions to meet Platform level Challenges," Intel Developer Forum, 2004.

* cited by examiner

TEST TOOL FOR POWER DISTRIBUTION NETWORKS

BENEFIT CLAIMS; RELATED APPLICATIONS; INCORPORATION BY REFERENCE

This application claims the benefit of U.S. Provisional Patent Appl. Ser. No. 62/425,366, filed Nov. 22, 2016, titled "TEST TOOL FOR POWER DISTRIBUTION NETWORKS", and U.S. Provisional Patent Appl. Ser. No. 62/452,828, filed Jan. 31, 2017, titled "INDUCTOR CURRENT MEASUREMENT PROBE", the entire contents for each of which are hereby incorporated by reference.

This application is related to U.S. patent application Ser. No. 15/215,280, filed Jul. 20, 2016, titled "UNIVERSAL POWER DISTRIBUTION TEST TOOL AND METHODOLOGY", the contents of which are hereby incorporated by reference.

TECHNICAL FIELD

The present disclosure relates to systems and methods for testing, validating, and debugging power distribution networks.

BACKGROUND

Power distribution involves the transfer of energy from a powers source to one or more electric load points. In the context of an electronic device or system, for instance, a power distribution network (PDN) may include, but is not limited to, an alternating current (AC) and/or direct current (DC) power supply to produce electric energy, supply rails to distribute the power from the power supply to one or more electrical components (the load point(s)) within the device/system, bypass capacitors to dampen or eliminate transient noise, hold-up converters to provide clean power in the event of temporary power spikes or drop-offs, and/or control circuitry to help maintain power integrity within the system. PDNs that are sub-optimally or improperly designed may have a significant impact on system operation and performance. In the worst case scenario, components of an electronic device may be damaged and cease to operate properly due to a faulty PDN design. In less severe scenarios, an improper or suboptimal design may result in excess transient noise, current imbalance, transfer function errors, and/or undesired impedance levels.

In order to validate and improve PDN designs, power engineers typically perform a set of tests on a prototype device in which the PDN is integrated. For example, a power engineer may run a first set of tests to detect transient noises, a second set of tests to determine impedance levels within the device, and a third set of tests to validate the power block transfer functions. Generally, each separate test involves different instrumentation, test setup, connections/probing and test methodology. For instance, the power engineer may connect an oscilloscope and transient source to a device under test (DUT) to analyze the transient response to a step-current load. Once complete, the power engineer may then move on to test the output impedance of the DUT by removing the probes and disconnecting the test equipment, connecting a dedicated impedance analyzer or vector network analyzer to the DUT, calibrating the impedance analyzer or vector network analyzer, and running a set of impedance tests on the DUT using the test equipment. A similar process may be performed for other tests, with the power engineer changing connections and test methodologies for each separate task.

While relying on different instrumentation allows for dedicated test equipment to be leveraged, the process of switching from one device to another may be cumbersome and prone to error. For each separate test, the power engineer is required to ensure that the test equipment has been set up and connected correctly, and that the testing methodology has been properly defined. Some test equipment, such as frequency response analyzers and vector network analyzers, require detailed calibration and skilled operators to function correctly. Power engineers that are unfamiliar with such test equipment risk incorrectly performing a validation test on the PDN or even overlooking the validation test itself.

In other cases, the set of test equipment available to a power engineer may not be able to perform all of the validation tasks required to thoroughly analyze and validate the PDN design. For instance, frequency-domain based data acquisition tools, such as frequency response analyzers and vector network analyzers, are typically limited to testing linear circuits or linearized testing of nonlinear circuits. Further these frequency-domain based tools typically have a relatively high low end cutoff frequency, which restricts their ability to be used for analyzing baseband and other low-frequency signals.

By comparison, time-domain based data acquisition tools generally require less calibration to operate than frequency-domain based tools and can measure non-linear responses. However, these tools often have limitations of their own. For example, traditional oscilloscopes have a much more limited range in accuracy and dynamic range than frequency response analyzers. In addition, many oscilloscopes are limited to four or fewer analog channels, which restricts the types of testing these devices are able to perform. Some power engineers attempt to address the deficiencies of traditional oscilloscopes by using a custom hardware chip as an interface between each channel of the oscilloscope and the DUT. However, not all power engineers have the time, expertise, or resources to develop such custom hardware. Due to such limitations and complexities in the test equipment and methodologies, power engineers face many potential pitfalls when attempting to validate a PDN design. If a validation task is overlooked or improperly performed, the analysis of the electrical performance of a DUT may be faulty or incomplete. As a results, suboptimal or faulty PDN designs may be inadvertently integrated and shipped in an end product.

The approaches described in this section are approaches that could be pursued, but not necessarily approaches that have been previously conceived or pursued. Therefore, unless otherwise indicated, it should not be assumed that any of the approaches described in this section qualify as prior art merely by virtue of their inclusion in this section.

BRIEF DESCRIPTION OF THE DRAWINGS

The embodiments are illustrated by way of example and not by way of limitation in the figures of the accompanying drawings. It should be noted that references to "an" or "one" embodiment in this disclosure are not necessarily to the same embodiment, and they mean at least one. In the drawings.

DETAILED DESCRIPTION

Figure 1A:
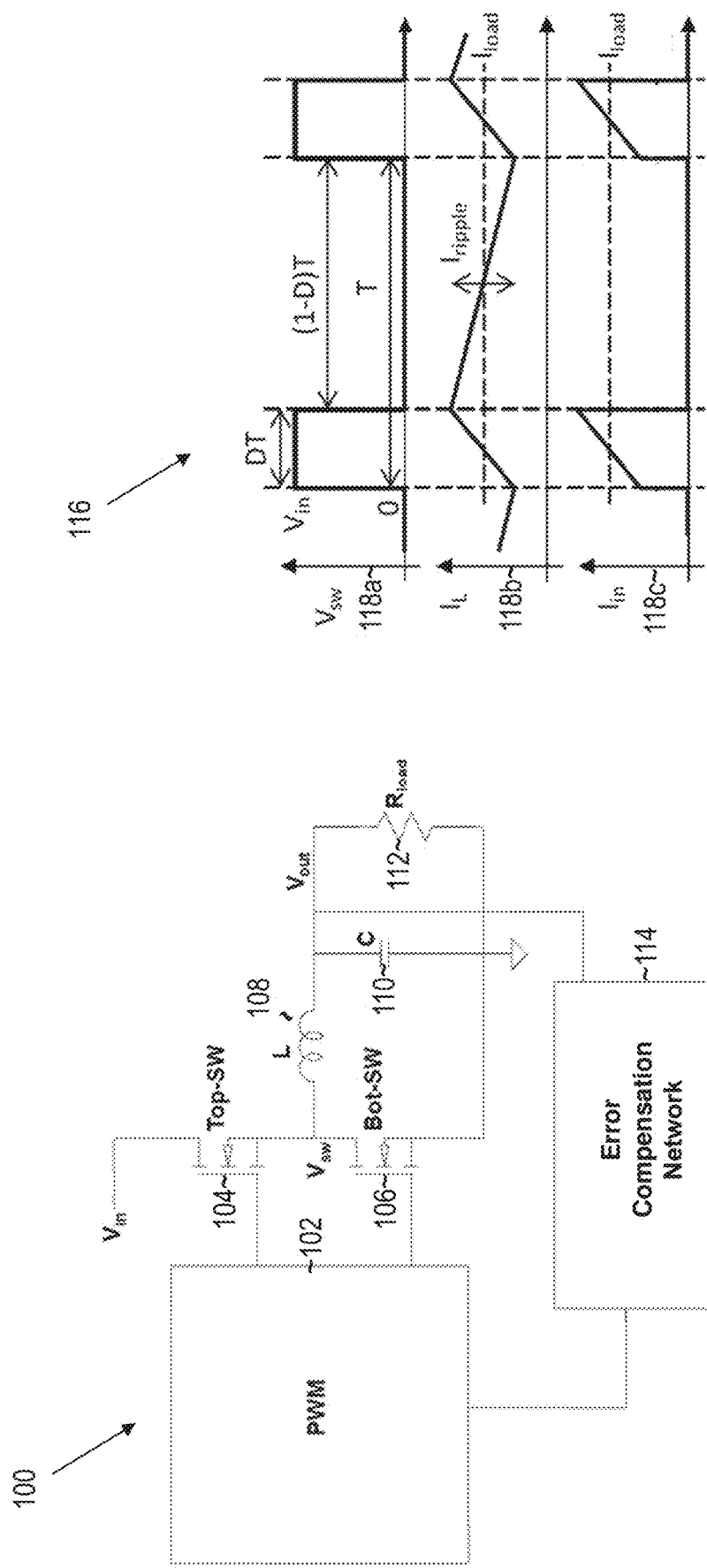
FIG. 1A illustrates a simplified block schematic of a non-isolated buck converter and a set of corresponding waveforms, in accordance with one or more embodiments

In the following description, for the purposes of explanation, numerous specific details are set forth in order to provide a thorough understanding. One or more embodiments may be practiced without these specific details. Features described in one embodiment may be combined with features described in a different embodiment. In some examples, well-known structures and devices are described with reference to a block diagram form in order to avoid unnecessarily obscuring the present invention.

1. GENERAL OVERVIEW
2. POWER CONVERSION CIRCUIT OVERVIEW
2.1 EXAMPLE CIRCUIT TOPOLOGIES
2.2 PERFORMANCE PARAMETERS
  2.2.1 CURRENT METRICS
  2.2.2 VOLTAGE METRICS
  2.2.3 TRANSIENT RESPONSE TO LOAD CURRENT CHANGES
  2.2.4 OUTPUT AND INPUT IMPEDANCE
  2.2.5 INPUT-TO-OUTPUT AND OUTPUT-TO-INPUT TRANSFER FUNCTIONS
3. UNIVERSAL PDN TEST TOOL
3.1 ARCHITECTURAL OVERVIEW
3.2 CONNECTION SCHEME
4. PERFORMANCE VALIDATION
4.1 DETERMINING INDUCTOR CURRENT
4.2 DETERMINING OUTPUT CURRENT
4.3 DIGITAL PROCESSING FILTERS AND ALTERNATE COMPUTATIONS
4.4 SAMPLING $V_{sw}$ TO PROVIDE BASELINE INDUCTOR CURRENT
4.5 WAVEFORM PROCESSING WEB
5. COMPUTING SYSTEM OVERVIEW
6. MISCELLANEOUS; EXTENSIONS

1. General Overview

Methodologies and systems are described herein whereby various performance parameters of power distribution networks (PDNs) may be tested. Example performance parameters that may be measured include, but are not limited to: (a) the current through an inductor in a power conversion; (b) the output current of one or more phases of the power conversion circuit; and (c) output voltages of one or more phases of the power conversion circuit. The methodologies and systems allow the performance parameters to be captured using the same instrumentation and connection schemes, without adding complex circuitry to a device-under-test (DUT). Thus, the cost and complexity of testing, validating, and debugging PDNs may be reduced.

2. Power Conversion Circuit Overview

Power conversion circuits are ubiquitous in electronic systems. For example, some power conversion circuits convert AC line voltage to 48 V or 12 V DC for system-wide distribution. As another example, large and small DC-DC converters feed individual integrated circuits or clusters of loads. In yet another example, low-current analog regulators feed sensitive analog circuits.

The electrical characterization of power converter circuits may involve testing, validating, and debugging various performance metrics. Example power conversion circuits and performance metrics are provided herein. However, the examples are provided for purposes of illustration and are not intended to be limiting. The techniques for testing, validating, and debugging performance metrics are generally applicable to single and multi-phase power conversion circuits, such as linear and switch-mode regulators, the design of which may vary from system to system. The performance metrics that are tested for a given power conversion circuit may also vary from implementation to implementation.

2.1 Example Circuit Topologies

Figure 1B:
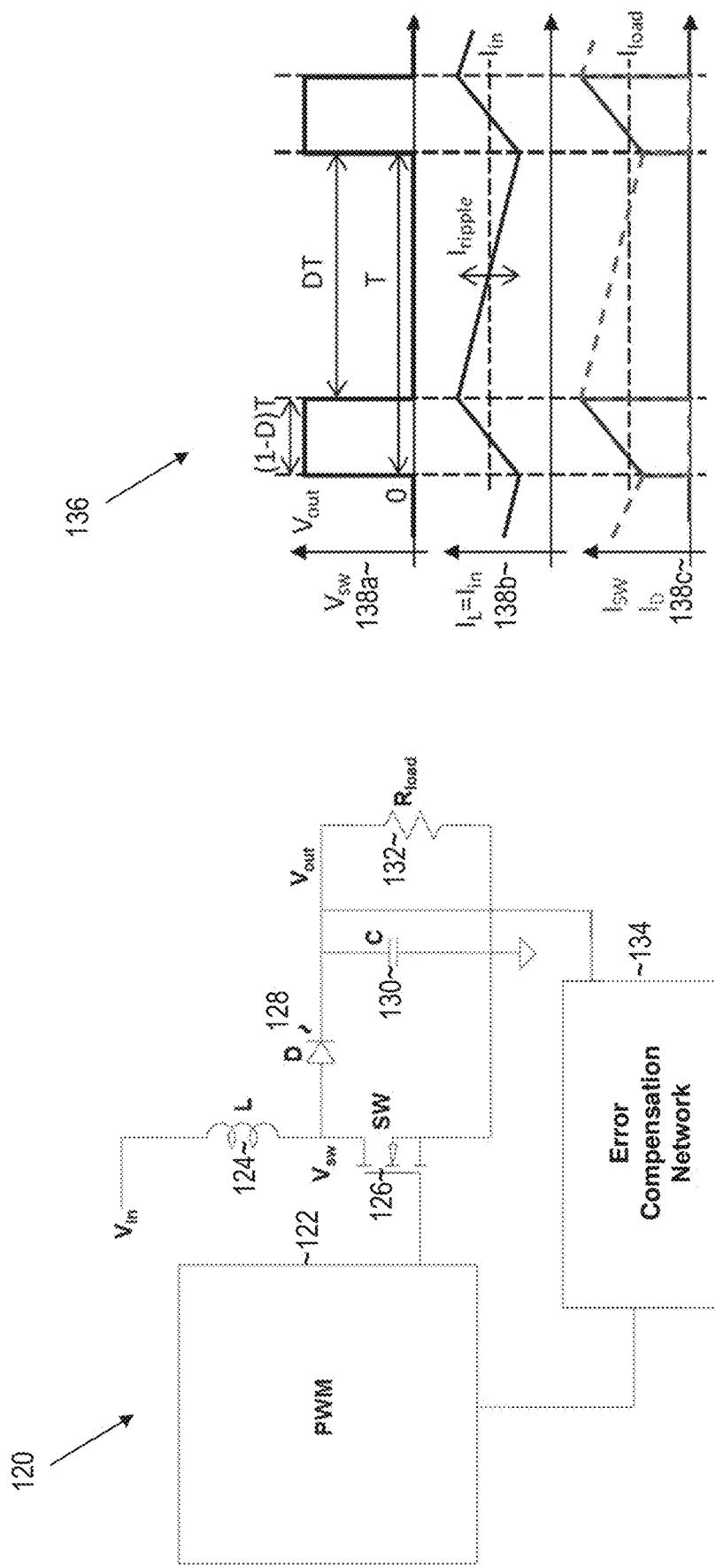
FIG. 1B illustrates a simplified block schematic of a non-isolated boost converter and a set of corresponding waveforms, in accordance with one or more embodiments.
Figure 1C:
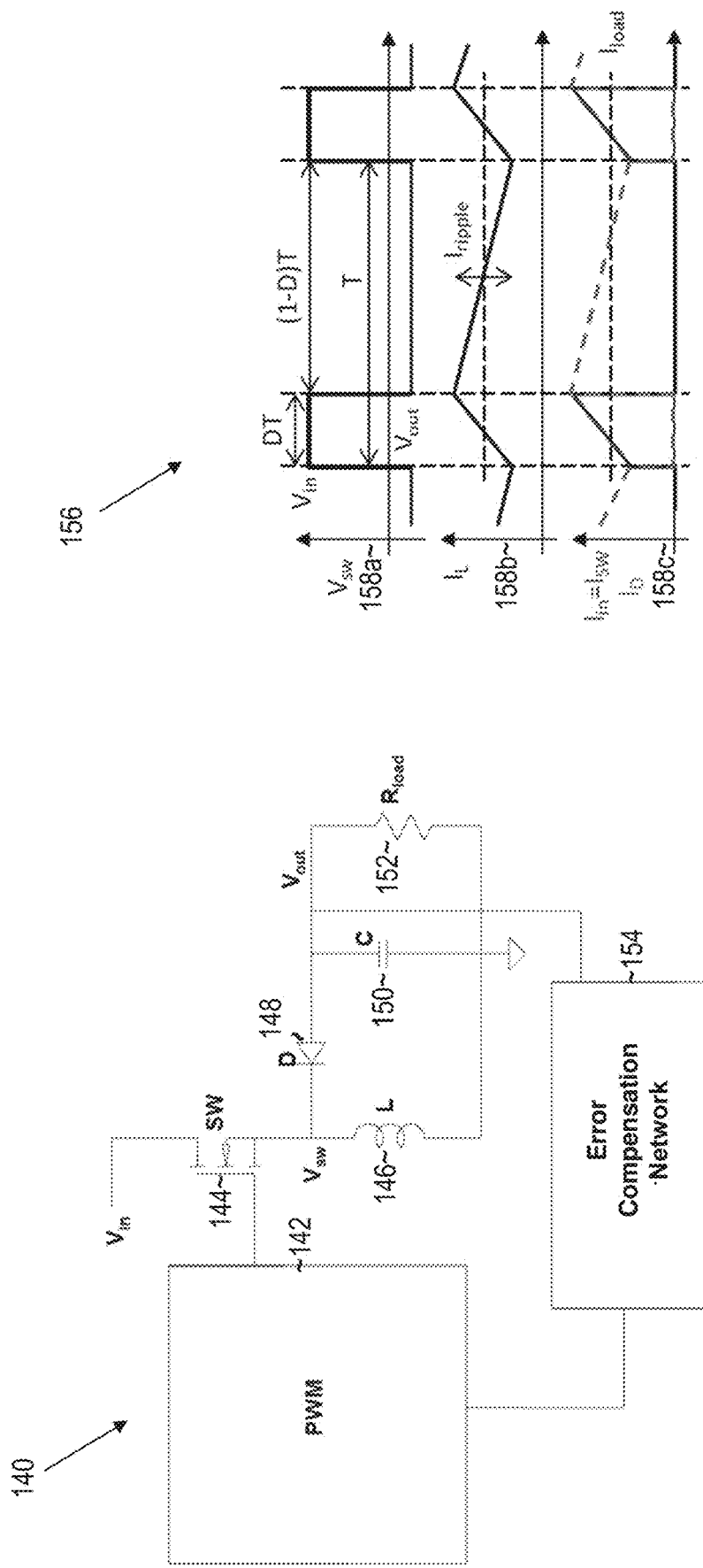
FIG. 1C illustrates a simplified block schematic of a non-isolated buck-boost converter and a set of corresponding waveforms, in accordance with one or more embodiments.

FIGS. 1A-1C illustrate schematics for different active voltage regulators and corresponding waveforms. As previously noted, these examples are provided to facilitate understanding and are not intended to be limiting. The test systems and methodologies may be applied to other active circuits in a PDN.

FIG. 1A illustrates a simplified block schematic of non-isolated buck converter 100. Non-isolated buck converter 100 comprises pulse-width modulator (PWM) 102, switch 104, switch 106, inductor 108, capacitor 110, load resistor 112, and error compensation network 114. The input voltage to non-isolate buck converter 100 is denoted $V_{in}$, the voltage across switch 106 is denoted $V_{sw}$, and the output voltage is denoted $V_{out}$. Waveform diagram 116 illustrates example waveforms for non-isolated buck converter 100. as follows:

Waveform 118a depicts voltage $V_{sw}$ over time, which corresponds to the voltage across switch 106. Time "T" represents the total period of the input signal $V_{in}$, and "DT" corresponds to the active period, where "D" represents the duty cycle.

Waveform 118b depicts current $I_L$ over time, which corresponds to the current across inductor 108. The inductor ripple current $I_{ripple}$ is the peak-to-peak value of the inductor current.

Waveform 118c depicts measurements of input current $I_{in}$, over time. The output current $I_{load}$ is also shown in waveforms 118b and 118c.

FIG. 1B illustrates a simplified block schematic of non-isolated boost converter 120. Non-isolated boost converter 120 comprises PWM 122, inductor 124, switch 126, diode 128, capacitor 130, load resistor 132, and error compensation network 134. Waveform diagram 136 illustrates example waveforms for non-isolated boost converter 120 as follows:

Waveform 138a depicts voltage $V_{sw}$ over time, which corresponds to the voltage across switch 126.

Waveform 138b depicts current $I_L$ over time, which corresponds to the current through inductor 124. In this arrangement, the inductor current $I_L$ is the same as the input current $I_{in}$, to the power conversion circuit.

Waveform 138c depicts switch current $I_{sw}$ and diode current $I_D$ over time, which respectively correspond to the current through switch 126 and diode 128.

FIG. 1C illustrates a simplified block schematic of non-isolated buck-boost converter 140. Non-isolated buck-boost converter 140 comprises PWM 142, switch 144, inductor 146, diode 148, capacitor 150, load resistor 152, and error compensation network 154. Waveform diagram 156 illustrates example waveforms for non-isolated buck-boost converter 140 as follows:

Waveform 158a represents measurements of voltage $V_{sw}$ over time.

Waveform 158b represents measurements current $I_L$ over time.

Waveform 138c represents measurement of input current $I_{in}$ over time. In this arrangement, the input current $I_{in}$ is the same as the switch current $I_{SW}$.

Figure 2:
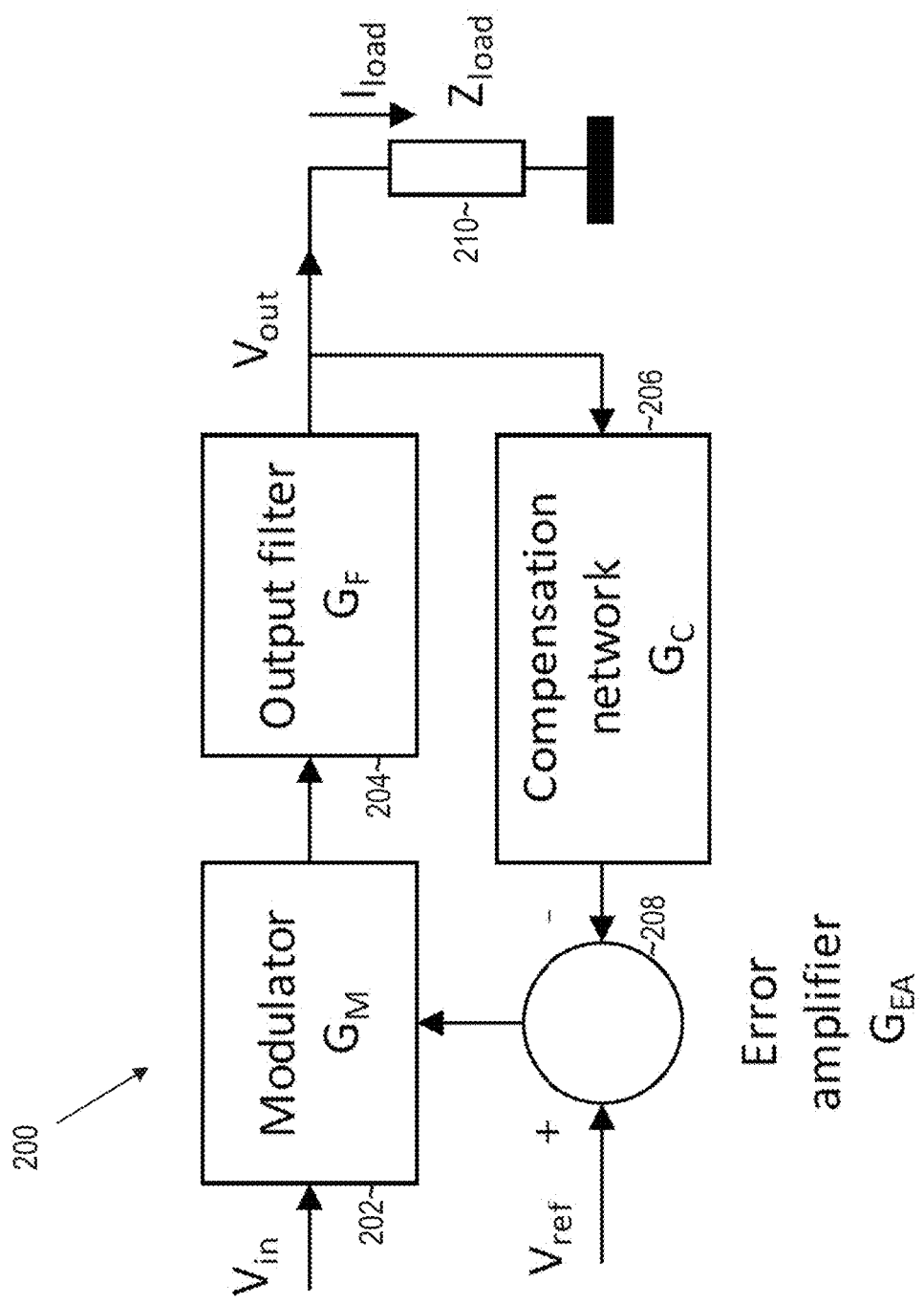
FIG. 2 illustrates a simplified block diagram of a power conversion circuit, in accordance with one or more embodiments.

A common characteristic of the depicted power conversion circuits is a control loop to stabilize one or more output parameters, such as the output voltage or the current shared among parallel phases in the power conversion circuit. The control loop may be represented as a compensation network that provides feedback to a modulator and triggering adjustments to maintain stability. For example, FIG. 2 illustrates a simplified block diagram of power conversion circuit 200. The power conversion circuit comprises modulator 202, output filter 204, compensation network 206, and error amplifier 208. The power converter provides power to one or more other circuits with a resistance represented by load 210. Compensation network 206 monitors $V_{out}$ deviations relative to a target (or reference) voltage $V_{ref}$. Compensation network 206 provides an error signal to error amplifier 208, which amplifies and sends the error to modulator 202. In response, modulator 202 performs one or more actions to minimize or eliminate the error. For example, modulator 202 may adjust the duty-cycle, peak current, and/or switching frequency provided to output filter 204. By minimizing the error, the output voltage $V_{out}$ that is provided to load 210 may be stabilized.

2.2 Performance Parameters

During testing, validation, and debugging, various performance metrics may be useful. These performance parameters may include, but are not limited to:

Current metrics including the input and output currents in the power converter, as well as current-sharing between parallel phases in multi-phase converters;

Voltage metrics including the input and output voltages as well as the stability of a voltage feedback loop;

Transient response to load current changes;

Output and input impedance; and/or

Input-to-output and output-to input transfer functions

A brief description of each of these performance parameters is provided in sections 2.2.1-2.2.5 below.

2.2.1 Current Metrics

As shown in the example waveforms, such as the waveforms illustrated in FIG. 1B, the input and output currents of a power conversion circuit may be determined from the inductor current. Thus, determining the inductor current is a useful performance parameter to capture. In addition, tracking the currents in the individual phases in a multi-phase converter is also a useful metric to validate and debug the stability of the current-sharing loop.

One approach for measuring the current is to use a dedicated shunt resistor placed in series to the current to be measured and measuring the voltage across the shunt resistor. However, the additional circuitry adds losses to the circuit, which is not desired. Inductor current may also be determined, indirectly, without adding losses, by leveraging the fact that inductors exhibit series resistance, which creates a one-pole exponential response for the inductor current for a constant voltage excitation. The time constant of the exponential change is $L/R_L$ where L is the value of the inductor and $R_L$ is the resistance of the inductor. If a series RC element is placed in parallel comprising resistance value $R_S$ and capacitance value $C_S$ such that that RC time constant is equal to the $L/R_L$ time constant, then the voltage across the $C_S$ capacitor is equal to the voltage across $R_L$. By measuring the voltage across the $C_S$ capacitor and knowing $R_L$, the current through the inductor may be determined. This sawtooth current waveform may exhibit high-frequency parasitic ringing near the switching edges. To compensate, blanking periods may be used to mask out a small percentage of the switching period near the rising and falling edges of the switch-node waveform. The DC average of the inductor current is the load current, and the AC portion closes through the output capacitor bank. The current closing through the input source and input capacitors is the ON portion of the inductor current.

Instead of or in addition to measuring the voltage across the $C_S$ capacitor, the voltage drops across switches, which may be field effect transistors (FETs), may be measured. For example, referring again to FIG. 1A, the voltage across the ON resistance of bottom-side switch 106 may be measured. During the OFF time for switch 106, the inductor current may be measured. The voltage drop across the ON resistance of the top-side switch 104 (which may also be a FET) may also be measured, though this approach may be more difficult due to the large common-mode voltage associated with the switch. In either case, the accuracy of measured current across the loss resistance of components depends on the accuracy of voltage measurement and accuracy of the estimate of loss resistance, which has not only unit-to-unit variations, but also temperature dependence and aging. The input or output currents may be measured either with the system's own (random or unknown) excitation or with a user-generated load-current stimulus. The latter approach is useful when the current measurement is done in all of the phases in a multi-phase regulator with transient load currents.

2.2.2 Voltage Metrics

Voltage metrics are also useful for validating and debugging PDN. In particular, the stability of a voltage feedback loop is critical to the correct functioning of most power converters. One approach to capture voltage metrics is to analyze the phase and gain margins of the open-loop gain curve in the frequency domain. Referring to FIG. 2, for example, a linearized model may be applied to each block to calculate the overall loop gain around the closed feedback loop. By denoting the gain of modulator 202 as $G_M$, the gain of output filter 204 as $G_F$, the gain of compensation network 206 as $G_C$, and the gain of error amplifier 208 as $G_{EA}$, the total loop gain may be determined as follows:

$$G_{loop} = G_M \cdot G_F \cdot G_C \cdot G_{EA} \quad (1)$$

The constituents of the loop-gain product, as shown in Eq. (1), may be frequency-dependent complex numbers. Two input variables may affect the output voltage including: (a) drift and/or transients in the input voltage and (b) drift and/or transients in the load current. In a linearized equivalent circuit of a power converter, the effect of input voltage variation may be described with a $\Delta V_{out}/\Delta V_{in}$ voltage transfer function and the effect of load current variation may be described through a $\Delta V_{out}/\Delta I_{load}$ impedance. The transfer and impedance functions may be determined as follows:

$$\frac{\Delta V_{out}}{\Delta V_{in}} = \frac{G_M(f) \cdot G_F(f)}{1 + G_{loop}(f)} \quad (2)$$

$$\frac{\Delta V_{out}}{\Delta I_{load}} = Z_{out\text{-}closed\text{-}loop}(f) = \frac{Z_{out\text{-}open\text{-}loop}(f)}{1 + G_{loop}(f)} \quad (3)$$

The $1+G_{loop}(f)$ denominator of these expressions is referred to as the characteristic expression.

The gain of individual blocks (or block groups) may be tested and validated. However, loop stability may be computed based on the total $G_{loop}$ function. Therefore, validating each test block individually may not be necessary depending on the particular application.

One approach to measure the loop gain is to inject a small swept-frequency test signal into the feedback loop at a point where in one direction the impedance is much lower than the injection impedance and in the other direction is much higher. The complex ratio of the voltages at the two terminals of the injection equals $G_{loop}$. The location for this point may be found where the output voltage divider is connected to the converter output. However, this approach relies on a dedicated frequency response analyzer with an output and two high-impedance inputs. As described further below, a universal PDN test tool may instead be used to measure voltage loop gain without the need for separate test equipment and connection setup.

2.2.3 Transient Response to Load Current Changes

Another useful performance metric to test is the transient response to load current changes. Transient response may be measured through time-domain tests where the output of the converter is excited with a given step current, and the output-voltage response is monitored with an oscilloscope. The magnitude, initial, and final values of the current step and the transition time may be changed to map out potential non-linear behaviors. For high slew-rate excitations, one challenge is to limit the inductances connecting the transient current source to the DUT. The performance tools and tests described further herein may limit or compensate for inductances in these cases.

2.2.4 Output and Input Impedance

Output and input impedances represent small-signal frequency-domain views of the DUT, though the AC excitation level may be set to any small or large value. Output impedance is a useful metric for target-impedance based PDN designs. Output impedance may be measured at different DC load currents and at different AC current magnitudes. Input impedance may be useful to determine as the real part is negative, potentially creating instabilities. Measuring input impedance may be challenging because the feeding impedance is generally low and the feed impedance is parallel to the injected test signal.

2.2.5 Input-to-Output and Output-to-Input Transfer Functions

The input-to-output transfer function, also referred to as the PSRR, may be measured by external voltage excitation applied to the input voltage and measuring the ratio. This parameter is a useful metric for low-noise regulators, where noise transmitted from the input side is to be minimized. The reverse function, output-to-input transfer function, may be of less use, because on the input side of voltage regulators, larger noise may be acceptable. To measure this transfer parameter, the output may be excited with an external source with a transient or swept-frequency sine waveform. During the excitation, the transfer function may be determined by measuring the complex ratio of $V_{in}/V_{out}$.

3. Universal PDN Test Tool

As the previous section illustrates, there are a wide variety of performance parameters that may be useful to validate and debug. In one or more embodiments, a universal PDN test tool may be configured to capture one or more of the above performance parameters. The universal PDN test tool may capture any combination of the above parameters using the same instrumentation and without changing the connection scheme. One or more of the performance parameters may be determined based on post-processing of the collected data, as described further herein.

3.1 Architectural Overview

Figure 3:
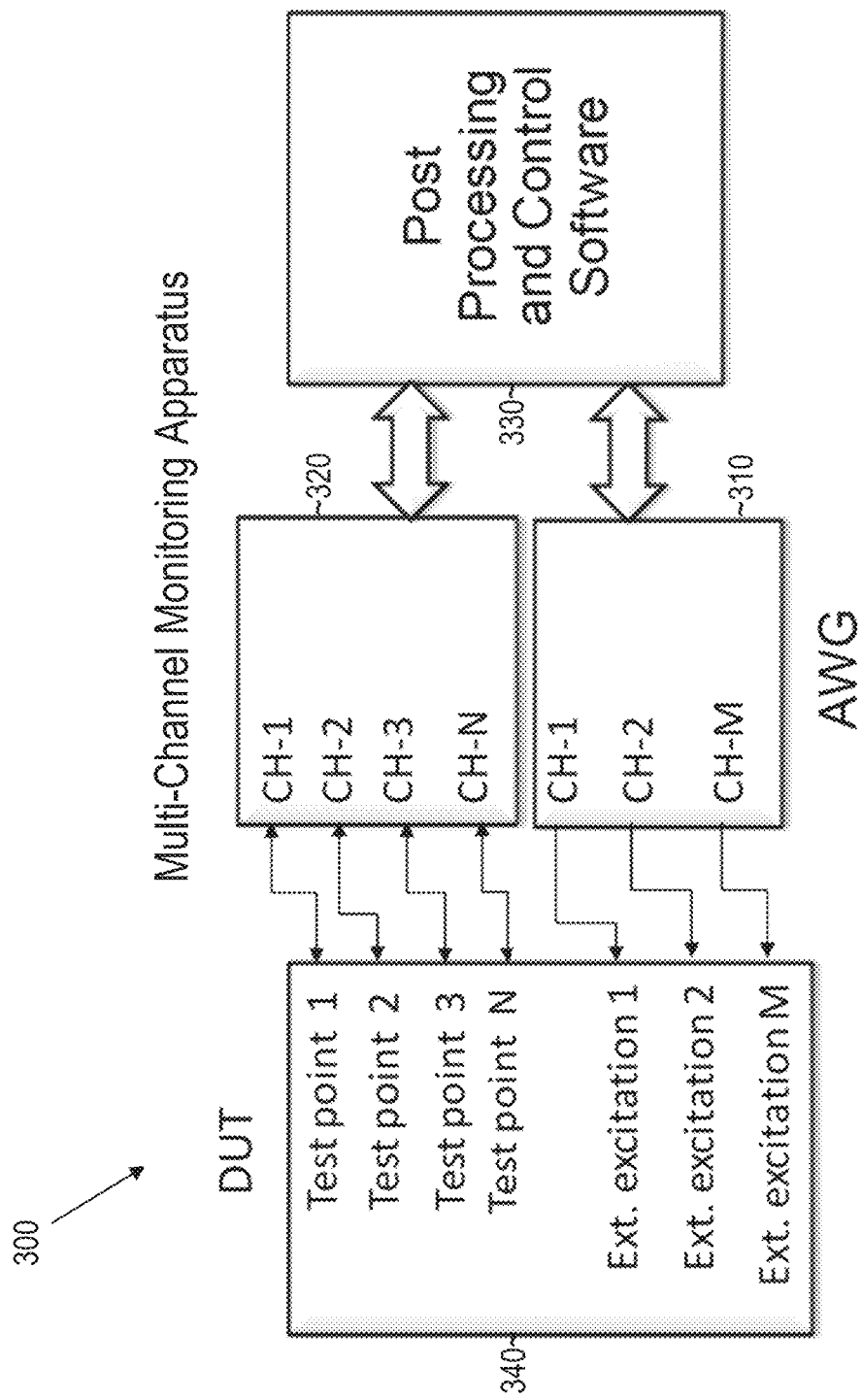
FIG. 3 illustrates an example universal PDN test system architecture, in accordance with one or more embodiments.

FIG. 3 illustrates an example universal PDN test system architecture, in accordance with one or more embodiments. System architecture 300 generally comprises AWG 310, multi-channel monitoring apparatus 320, and post-processing and control logic 330. Components of test system 300 may be implemented as part of the same device or on separate devices. For example, post-processing and control logic 330 may be configured to execute on a multi-channel monitoring device, such as an oscilloscope comprising one or more hardware processors. By integrating each of these components onto a single device, the amount of equipment involved in testing the electrical performance of DUT 340 may be minimized to a single piece of instrumentation. In other embodiments, post-processing and control logic 330 may execute on a computing device that is external to and communicatively coupled to the multi-channel monitoring device.

AWG 310 includes hardware logic or a combination of hardware and software logic used to generate and output any arbitrarily defined electrical waveform(s) over one or more channels. Each output channel in AWG 310 is electrically coupled during testing to a corresponding external excitation point of DUT 340. The electrical waveforms are injected by AWG 310 into DUT 340 through the corresponding external excitation point. The waveforms may comprise sine waves, square waves, test impulses, transient inputs, or any other arbitrary waveform. Further, the waveforms may correspond to a current source or a voltage source. This allows AWG 310 to inject a large range of signals into the device by varying the current and/or voltage waveforms at one or more excitation points.

In one or more embodiments, AWG 310 includes one or more components for varying the power of a signal injected into DUT 340 without distorting the waveform. For example, AWG 310 may include an attenuator that reduces the power of a signal provided to one or more external excitation points. In addition or alternatively, AWG 310 may include an amplifier to increase the power of the signal at the one or more external excitation points. AWG 310 may also include additional current-boost circuits.

In one or more embodiments, AWG 310 includes one or more components for modulating the output waveform provided to DUT 340 along one or more channels. The components may include, but are not limited to a set of one or more voltage-controlled oscillators that control the frequency and/or phase of the output waveform. For instance, AWG 310 may comprise a first voltage-controlled oscillator that adjusts the frequency of a signal on a first channel in response to a first control voltage and a second voltage-controlled oscillator that adjusts the phase of the signal in response to a second control voltage. Additional voltage controlled oscillators may be used to control other channels between AWG 310 and DUT 340, if any. Thus, the phase and frequency of the signal injected into each external excitation point may be individually controlled.

AWG 310 may generate and inject waveforms into DUT 340 on a continuous or single-shot basis, depending on the particular configuration. If generating waveforms on a continuous basis, AWG 310 may be configured to inject the waveforms for: (a) a set amount of time, (b) indefinitely until an external trigger is received, or (c) DUT 340 is disconnected. Further, AWG 310 may be configured to sweep through different waveforms, such as by varying the phase, frequency, amplitude and/or shape of the waveform over predefined time intervals.

Multi-channel monitoring apparatus 320 includes hardware logic or a combination of hardware and software logic for capturing time-domain measurements over a plurality of channels. Each input channel is configured to be electrically coupled during the testing process to a corresponding test point within DUT 340. For instance, an input channel may be electronically coupled through a voltage and/or current probe. The waveforms that are monitored at a given test point may correspond to time-domain measurements of current, voltage, and/or other electrical properties, such that changes in these properties at the corresponding test point over time may be captured.

In one or more embodiments, multi-channel monitoring device 320 is a high resolution multi-channel oscilloscope or subcomponent therein that is configured to capture time-domain measurements from three or more channels. A high resolution oscilloscope in this context refers to an oscilloscope having a resolution of at least twelve bits. High resolution oscilloscopes are able to capture a much wider range of frequencies over an input channel with much greater accuracy than a traditional 8-bit oscilloscope. For instance, a twelve-bit oscilloscope may be able to provide an additional 20 decibel spectral range while capturing signal details that would be missed by an eight-bit oscilloscope. The additional range and accuracy allow for a combination of time-domain and/or frequency-domain based validation tasks that are unavailable on traditional single-channel, eight-bit oscilloscope.

Post-processing and control logic 330 comprises software logic, hardware logic, or some combination thereof for initializing and controlling operation of AWG 310 and multi-channel monitoring apparatus 320. With respect to AWG 310, post-processing and control logic 330 may initialize and control the timing, amplitude, phase, frequency and/or other characteristics of a waveform that is injected into DUT 340. For example, control logic 330 may provide signals to one or more voltage controlled oscillators within AWG 310 such that the frequency and/or phase of a generated waveform may be controlled. As another example, control logic 330 may provide control signals to an attenuator and/or amplifier within AWG 310 to adjust the amplitude of a generated waveform. Post-processing and control logic 330 may also cause AWG 310 to sweep through signals having different frequencies, phases, amplitudes, and/or shapes at predefined timing intervals or in response to a sweep trigger.

With respect to multi-channel monitoring apparatus 320, post-processing and control logic 330 may initialize or otherwise define the parameters controlling how time-domain measurements (the "test data") are captured. For example, post-processing and control logic 330 may initialize voltage scales and the sweep parameters within a multi-channel oscilloscope. Other parameters may control how captured time-series data is displayed on the oscilloscope, such as the vertical and/or horizontal position of a displayed waveform, In one or more embodiments, post-processing and control logic 330 is configured to extract a set of performance parameters as described in further detail below. During extraction, post-processing and control logic 330 may simulate various scenarios by adjusting the excitation signals provided to DUT 340 over one or more channels. For example, post-processing and control logic 330 may cause AWG 310 to step the current and/or voltage up and/or down at varying intervals, inject current and/or voltage transients into the excitation points, and vary the excitation points where external signals are injected. Post-processing and control logic 330 may then aggregate the test data captured by multi-channel monitoring apparatus 320 and evaluate the test data to generate a set of results for the validation tasks. These results may be stored in volatile and/or non-volatile storage and displayed to an end user, such as on the monitor of an oscilloscope or some other computing device.

DUT 340 may be any electronic device for which the electrical performance is to be evaluated by test system 300. DUT 340 may comprise a linear circuit and/or a non-linear circuit that is tested by test system 300. A "linear circuit" in this context refers to a circuit in which the output voltage is directly proportional to the input voltage. By contrast, in nonlinear circuits, the output voltage of the circuit is not directly proportional to the input voltage of the circuit. Example components that may introduce nonlinearity into a circuit may include, but is not limited to, transistors, such as metal-oxide-semiconductor field-effect transistors (MOSFETs) and bipolar junction transistors (BJTs), diodes, and transformers. Example circuits that may be nonlinear may include, but is not limited to, integrated circuits comprising MOSFETs, rectifiers, and some multi-phase power converters. By capturing time-domain measurements rather than frequency-based measurements, test system 300 may more effectively evaluate the nonlinear performance of an electrical circuit as the response may be more easily analyzed as a function of time.

In one or more embodiments, AWG 310 may be disabled or omitted from test system 300. In these implementations, test system 300 may be used to monitor the normal operation of DUT 340 without any external signals injected into the external excitation points. This configuration may be sufficient to validate the performance of DUT 340 in a normal operating environment. However, the inclusion of AWG 310 allows for the simulation and injection of signals that might occur in scenarios that are relatively uncommon and hard to capture during normal operations of a device.

3.2 Connection Scheme

The test points in DUT 340 may include, but are not limited to, switch node(s) output voltage(s) and input voltage(s). With a predefined stimulus and some basic parameters of a regulator circuit, the voltages at the test points may be leveraged to provide a description of any combination of the performance parameters previously described. For example, if the inductance and resistance of the output inductor is known, then the inductor current may be back-calculated from the voltages at the switch node and the output, as described further below. By determining the inductor current waveform and by identifying the ON and OFF times of the switching waveforms, other validation parameters, such as output current, may also be determined.

Figure 4:
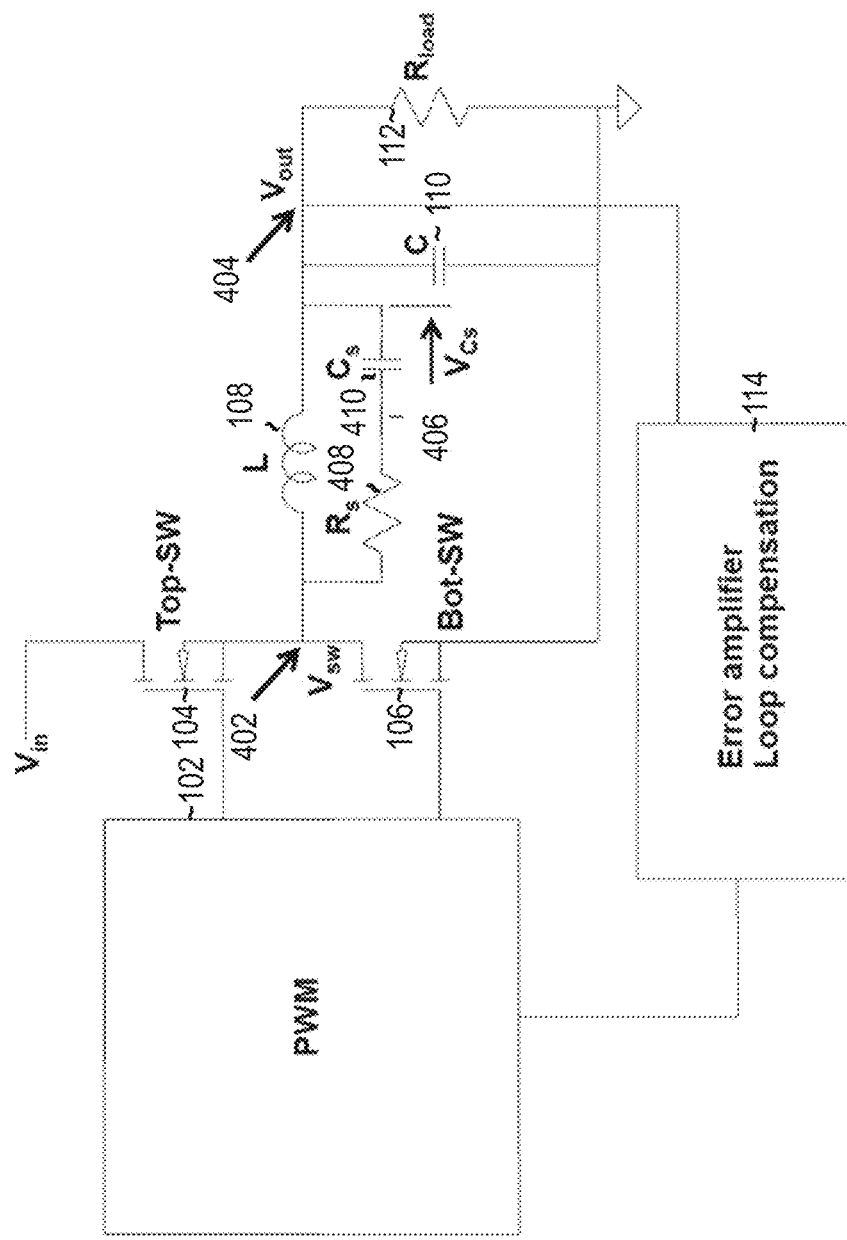
FIG. 4 illustrates example probing locations for measuring inductor current, in accordance with one or more embodiments.

FIG. 4 illustrates example probing locations for measuring inductor current, in accordance with one or more embodiments. Probe location 402 falls between switch 104 and switch 106 in a non-isolated buck converter. A probe from multi-channel monitoring device 320 may be placed at probe location 402 to measure the switch voltage $V_{sw}$. Additionally or alternatively, probes from multi-channel monitoring device 320 may be placed at probe locations 404 and/or 406. Probe location 406 is positioned in the series RC component that is parallel to inductor 108. The RC component comprises resistor 408 and capacitor 410. A probe may be coupled to probe location 404 to measure $V_{cs}$, which is the voltage across capacitor 410. Another probe may be coupled to probe location 406 to measure $V_{out}$. By concurrently monitoring probe locations 402, 404, and 406, a variety of validation parameters may be determined, as described in further detail below.

4. Performance Validation

In one or more embodiments, test system 300 performs a set of one or more validation tests to evaluate the electrical performance of DUT 340. The validation tests may measure, compute, or otherwise extract any combination of the aforementioned performance parameters. Example techniques for computing performance parameters, including inductor current, output current, and inductor voltage, are described in the subsections below.

4.1 Determining Inductor Current and Related Parameters

In one or more embodiments, the set of validation tests includes a test to measure or otherwise extract the inductor current. As mentioned previously, one approach is to construct a circuit containing a combination of a series resistor and capacitor shunting the inductor L and measuring the differential voltage. To avoid this extra circuitry, inductor current may instead be determined from measurements of switch node voltage $V_{sw}$ and the output voltage $V_{out}$. The measured voltage $V_{cs}$ may be used to correlate the switch node voltage and output voltage measurements.

Given the measurements of switch node voltage $V_{sw}$ and the output voltage $V_{out}$, the inductor current $I_L$ may be determined through processing. With consideration of the voltage across the inductor, inductor current may be computed as follows:

$$I_L(s) = \frac{V_{out}(s) - V_{sw}(s)}{s \cdot L + R_L} = \frac{V_L(s)}{s \cdot L + R_L} \quad (4)$$

In this scenario, $V_L$ is the difference between $V_{out}$ and $V_{sw}$. Also, since $V_{out}$ is relatively constant, a relatively large vertical gain may be applied to the monitoring channel measuring this performance parameter. On the other hand, since $V_{sw}$ encompasses the full swing at the switch node, swinging nominally between ground and $V_{in}$, in this case a low vertical gain may be applied to the monitoring channel measuring this performance parameter. To achieve a large vertical gain, a low voltage per division (VDIV) setting may be applied to a channel. Conversely, a low vertical gain may be achieved by using a high VDIV setting.

In one or more embodiments, the inductor current may be processed digitally, such as through a digital filter for processing sampled waveforms. In sampled systems, the approximation of the derivative may be determined. The approximation allows conversion from the Laplace transform to the z transform as follows:

$$s \approx \frac{1}{T} \cdot (1 - z^{-1}) \quad (5)$$

In Eq. (5), T is the sample period is 1/Fs, where Fs is the sample rate.

By performing substitution, inductor current may be determined via digital sampling as follows:

$$I_L(z) = \frac{V_L(z)}{\frac{L}{T} \cdot (1 - z^{-1}) + R_L} \quad (6)$$

$$= \frac{V_L(z)}{\left(\frac{L}{T} + R_L\right) - \frac{L}{T} \cdot z^{-1}}$$

$$= \frac{V_L(z)}{\left(\frac{L + R_L \cdot T}{T}\right) - \frac{L}{T} \cdot z^{-1}}$$

$$= \frac{T}{L + R_L \cdot T}\left(V_L(z) \cdot \frac{L}{T} \cdot z^{-1} \cdot I_L(z)\right)$$

$$= \frac{T}{L + R_L \cdot T} V_L(z) + \frac{L}{L + R_L \cdot T} \cdot z^{-1} \cdot I_L(z)$$

Taking the inverse z transform, the different equation of the inductor current with respect to the voltage across the inductor may be represented as follows:

$$I_L[k] = \frac{T}{L + R_L \cdot T} \cdot V_L[k] + \frac{L}{L + R_L \cdot T} \cdot z^{-1} \cdot I_L[k-1] \quad (7)$$

The transfer function that produces the inductor current from the inductor voltage may be written as:

$$H_L(z) = \frac{I_L(z)}{V_L(z)} \quad (8)$$

$$= \frac{\frac{T}{L + R_L \cdot T}}{1 - \frac{L}{L + R_L \cdot T} \cdot z^{-1}}$$

$$= \frac{T}{L + R_L \cdot T} \cdot \frac{1}{1 - \frac{L}{L + R_L \cdot T} \cdot z^{-1}}$$

$$= \frac{T}{L + R_L \cdot T} \cdot \frac{z}{z - \frac{L}{L + R_L \cdot T}}$$

When $L \gg R_L \cdot T$:

$$H_L(z) \approx \frac{T}{L} \cdot \frac{1}{1 - z^{-1}} \quad (9)$$

which means that:

$$I_L(t) \approx \frac{1}{L} \int V_L(t) \cdot dt \quad (10)$$

Returning to the transfer function for $H_L(z)$ in Eq. (8), the DC gain of the function may be represented as follows:

$$G = \frac{T}{L+R_L \cdot T} \cdot \frac{z}{z - \frac{L}{L+R_L \cdot T}} \bigg|_{z=1} = \quad (11)$$

$$\frac{T}{L+R_L \cdot T} \cdot \frac{1}{1 - \frac{L}{L+R_L \cdot T}} = \frac{1}{R_L}$$

As can be seen from Eq. (11), the series resistance $R_L$ prevents the computation from diverging.

For nonzero $R_L$, the gain may be taken outside of the filter computation, resulting in a new transfer function as follows:

$$H_L(z) = \frac{1}{R_L} \cdot \frac{R_L \cdot T}{L+R_L \cdot T} \cdot \frac{1}{1 - \frac{L}{L+R_L \cdot T} \cdot z^{-1}} \quad (12)$$

and a new difference equation:

$$R_L \cdot I_L[k] = \frac{R_L \cdot T}{L+R_L \cdot T} \cdot V_L[k] + \frac{L}{L+R_L \cdot T} \cdot I_L[k-1] \quad (13)$$

The pole of the transfer function of Eq. (12) is located at:

$$\frac{L}{L+R_L \cdot T} \quad (14)$$

Poles of the transfer function are useful for determining whether the system is stable and how well the system performs. Poles that are close to unity may be problematic in filtering in that that may result in high precision and long filter startup times. The time constant for this system is given by:

$$\tau = \frac{L}{R_L} \quad (15)$$

In practice, a sample rate of 100 Mega-samples per second (MS/s) for a sample period of 10 nanoseconds (10 ns) was observed to settle the filter in approximately five time constants 5·τ. Filter startup times may be improved by sampling at a lower rate.

4.2 Determining Output Current

Given the inductor current $I_L$ provided in the previous subsection, the output current of the power conversion circuit, denoted $I_{out}$ may be determined. Specifically, the currents may be summed away from the voltage node at $V_{out}$ as follows:

$$-I_L(s) = \frac{V_{out}(s)}{\frac{1}{C \cdot s}} + I_{out}(s) = 0 \quad (16)$$

$$I_{out}(s) = I_L(s) - C \cdot s \cdot V_{out}(s) \quad (17)$$

Again, the approximation of the derivative per Eq. (5) above allows conversion from the Laplace transform to the z transform as follows:

$$I_{out}(z) = I_L(z) - \frac{C}{T} \cdot (1 - z^{-1}) \cdot V_{out}(s) \quad (18)$$

$$I_{out}[k] = I_L[k] - \frac{C}{T} \cdot (V_{out}[k] - V_{out}[k-1]) \quad (19)$$

Thus, provided measurements of $V_{sw}$ and $V_{out}$, the measurements of both the inductor current $I_L$ and the output current $I_{out}$ may be determined.

4.3 Digital Processing Filters and Alternate Computations

In one or more embodiments, post-processing and control logic 330 comprises one or more digital processing filters to compute $I_L$ and $I_{out}$ based on the sampled measurements of $V_{sw}$ and $V_{out}$. The digital processing filter may be applied via one or more digital signal processors, such as waveform processors as described further below, and/or through post-processing software.

Figure 5:
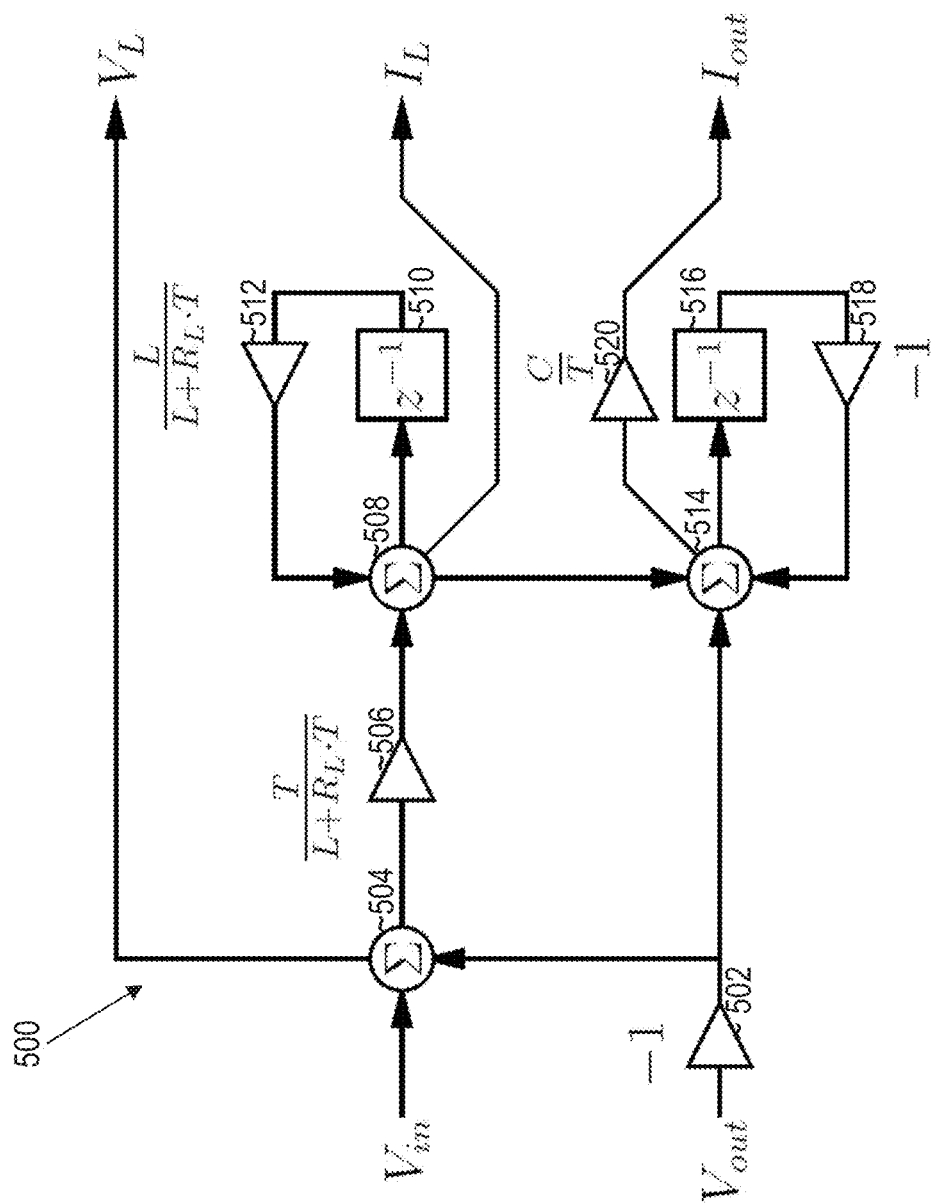
FIG. 5 illustrates an example digital processing filter for extracting inductor voltage, inductor current, and output current based on provided input and output voltage measurements, in accordance with one or more embodiments.

FIG. 5 illustrates example digital processing filter 500 for extracting inductor voltage, inductor current, and output current based on provided input and output voltage measurements, in accordance with one or more embodiments. Digital processing filter 500 comprises inverter 502 which inverts the provided signal $V_{out}$. Adder 504 receives the inverted signal from inverter 502 and adds the inverted signal to the provided signal $V_{in}$. As previously noted, $V_{out}$ and $V_{in}$ may be measured by multi-channel monitoring apparatus 320. The output of adder 504 is $V_L$, which corresponds to the voltage across the inductor.

To compute the inductor current, the output of adder 504 is provided to multiplier 506, which multiples the signal with $$\frac{T}{L+R_L \cdot T}.$$

Inductor current may then be computed with reference to adder 508, transform block 510, and multiplier 512. Adder 508 adds the output of multiplier 506 and 512. In the feedback loop, transform block 510 performs the inverse z transform of the output signal received from adder 508, and multiplier 512 multiplies this signal with $$\frac{L}{L+R_L \cdot T}.$$

Once the digital filter settles, the output of adder 508 approximates the inductor current $I_L$ per Eq. (7) above.

To compute the output current, adder 514 sums the inductor current with the output of inverter 502 and the feedback loop comprising transform block 516 and inverter 518. Multiplier 520 then multiplies the output of adder 514 by $$\frac{C}{T}$$

to provide $I_{out}$ per Eq. (17) above.

The digital filter and computation of $I_{out}$ above does not account for potential parasitic s that may be associated with the circuit. These parasitic s may include parasitic inductance denoted $L_C$ and parasitic resistance denoted $R_C$ associated with the output capacitor. With the full set of parasitics inserted, Eq. (16) may be rewritten as follows:

$$-I_L(s) + \frac{V_{out}(s)}{\frac{1}{C \cdot s} + s \cdot L_C + R_C} + I_{out}(s) = 0 \quad (20)$$

Parasitic parameter A may be defined as follows:

$$A = \frac{T^2}{T^2 + L_C \cdot C + R_C \cdot C \cdot T} \quad (21)$$

and the difference equation becomes:

$$I_{out}[k] = I_L[k] \pm C \cdot A \cdot \frac{2 \cdot L_C + R_C \cdot T}{T^2} \cdot I_L[k-1] + \frac{L_C \cdot C}{T^2} \cdot A \cdot I_L[k-2] \ldots + C \cdot A \cdot \frac{2 \cdot L_C + R_C \cdot T}{T^2} \cdot I_{out}[k-1] + -\frac{L_C \cdot C}{T^2} \cdot A \cdot I_{out}[k-2] + \ldots + -\frac{C}{T} \cdot A \cdot V_{out}[k] + \frac{C}{T} \cdot A \cdot V_{out}[k-1] \quad (22)$$

In the event that $L_C = R_C = 0$, then $A=1$ and Eq. (22) is equal to Eq. (19).

Figure 6:
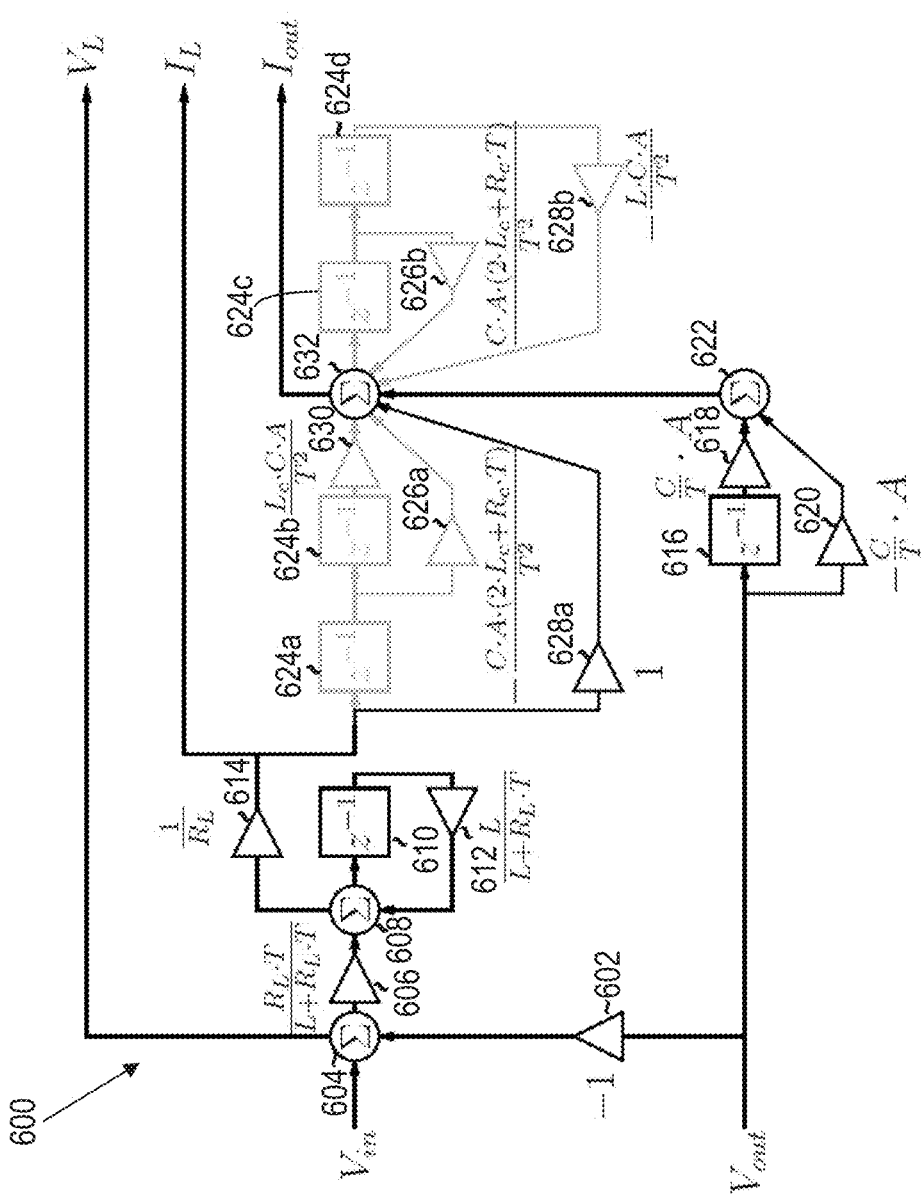
FIG. 6 illustrates an example digital processing filter for extracting inductor voltage, inductor current, and output current based on measured input and output voltages, in accordance with one or more embodiments.

FIG. 6 illustrates example digital processing filter 600 for extracting inductor voltage, inductor current, and output current based on measured input and output voltages. Digital processing filter 600 is an alternative arrangement to digital processing filter 500, and accounts for parasitic capacitances in the computation of $I_{out}$ per Eq. (22). Digital processing filter 600 generally comprises inverter 602 and adder 604 to compute $V_L$. Digital processing filter 600 further comprises multiplier 606, adder 608, transform block 610, multiplier 612, and multiplier 614 to compute $I_L$. The inverters, adders, multipliers, and transform blocks operate as previously described. The multiplier functions are depicted next to the corresponding multipliers.

To compute $I_{out}$, the signal $V_{out}$ is provided to a processing block comprising transform block 616, multiplier 618, multiplier 620, and adder 622. The output of this processing block and $I_L$ are provided to another processing block comprising transform block 624a-d, multipliers 626a-b, multipliers 628a-b, multiplier 630, and adder 632. The combined effect of these processing blocks is to compute $I_{out}$ per Eq. (22). The processing elements that are grayed out are functions of the nonzero parasitics for the capacitor $R_C$ and $L_C$.

4.4 Sampling $V_{sw}$ to Provide Baseline Inductor Current

The calculation of $I_L$ per the above techniques involves acquiring waveforms from the switch node $V_{sw}$ and the output $V_{out}$, taking the difference to form $V_L$, and processing this voltage with a filter with a transfer function as in Eq. (4). This process may provide accurate approximations of dynamic inductor current, meaning that the high-frequency portion of the inductor current. However, noise (also referred to herein as "wander") may affect the accuracy of the measurements in the low frequency range. A high-pass filter may be applied to $I_L$ may be applied to remove the wander, but the low frequency performance of the calculation is then lost.

To restore the low frequency portion (referred to herein as the "baseline inductor current") of the calculation without the noise, sampling may be performed with reference to $V_{sw}$. Sampling may be performed on the difference between $V_{in}$ and $V_{sw}$ on the top portion of $V_{sw}$ or the difference between $V_{sw}$ and ground on the bottom portion of $V_{sw}$. Using the bottom portion of $V_{sw}$ may be advantageous because a measurement between a voltage and ground may be determined by a single-ended voltage measurement. However, sampling the bottom portion may be complicated where a voltage regulator module has a schottky diode in place of the low-side FET, which cause the resistance of the path to be highly variable and temperature dependent.

The sample measurements may be gated to endure the full swing of $V_{sw}$. One approach is to use external circuitry based on the rising or falling edge of $V_{sw}$ to gate the difference waveform in a region where the differential voltage is relatively small. To avoid external circuitry, an oscilloscope overdrive recovery may be used to gate the difference. In this case, the oscilloscope may be zoomed in on the upper or lower difference portion of $V_{in}-V_{sw}$ (for the difference on the top portion) or $V_{sw}$ (for the difference on the bottom portion).

The gated difference waveform may then be used to determine baseline inductor current. For example, the baseline inductor current may be defined as the average inductor current over once cycle of the switched voltage waveform. The inductor baseline current may be calculated by sampling a smoothed version of an over-driven switch voltage approximately around the middle to the end of the switch voltage cycle. As this approach may be performed as a per-cycle measurement of the voltage drop across a FET switch when the switch is connected to ground, the inductor current is proportional to the voltage. Once computed, the baseline inductor current may be used to augment the inductor dynamic current defined by dynamic voltage across the inductor.

4.5 Waveform Processing Web

In one or more embodiments, post-processing and control logic 330 comprises a set of waveform processors to extract one or more of the aforementioned performance parameters. A waveform processor in this context refers to a digital signal processor that may be configured to perform a dedicated signal processing task such as sampling waveforms from provided input signal, applying digital filters, and outputting generated waveforms. Oscilloscopes may be equipped with a plurality of waveform processors to analyze and generate waveforms. Additionally or alternatively, waveform processors may be implemented in hardware, software, or some combination thereof.

Figure 7:
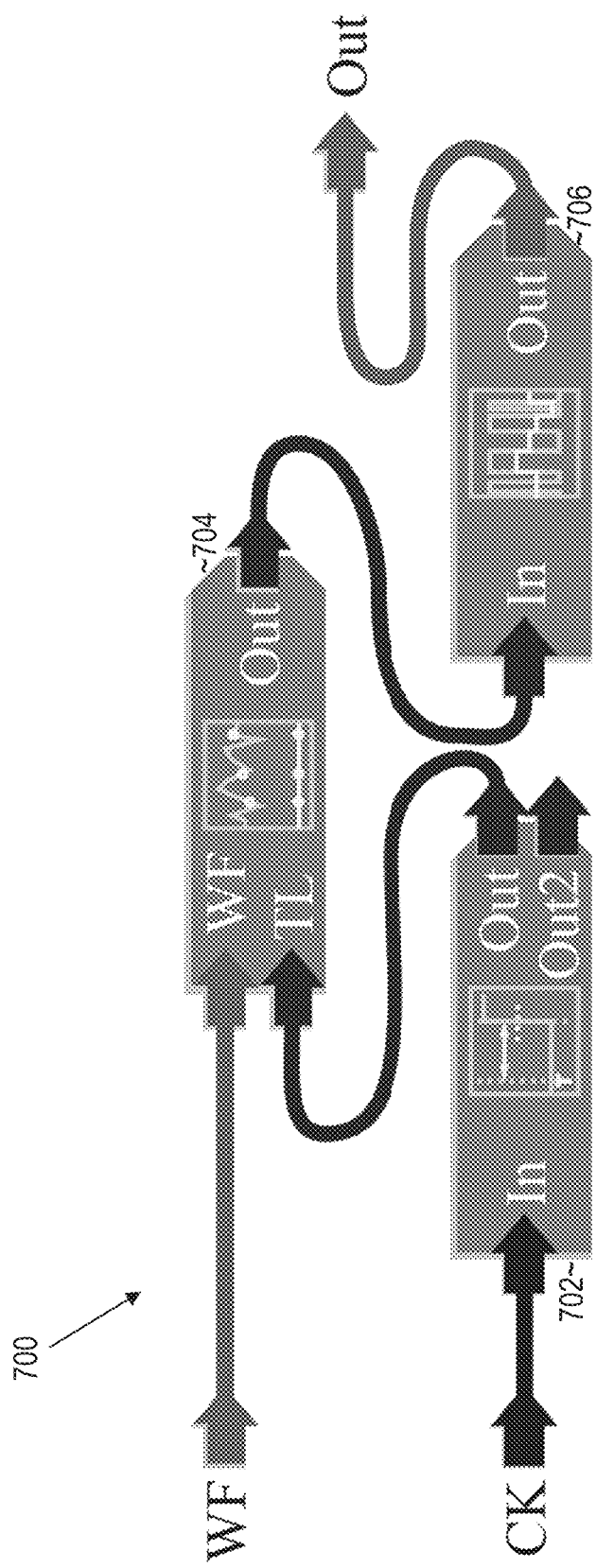
FIG. 7 illustrates an example waveform processor, in accordance with one or more embodiments.

FIG. 7 illustrates example waveform processor 700 in accordance with one or more embodiments. Waveform processor 700 is a composite processor that has two inputs:
  WF—the waveform to sample; and
  CK—the clock waveform.
Waveform processor 700 has a single output: the sample waveform.

Internally, composite waveform processor 700 comprises three separate processors: processor 702, processor 704, and processor 706. Processor 702 determines the locations of clock edges on the clock waveform CK based on specified polarity, threshold, and hysteresis values and passes these values to the TL input of processor 704. Processor 704 then interpolates values on the waveform supplied at the clock edge times and outputs parameter values that are the coordinates of the sample waveform where the x ordinate is the clock edge time and the y ordinate is the value of the waveform at that time. Processor 706 is utilized to turn the parameter values back into a waveform representing the sampled waveform. The track produces a waveform with the same sample locations as the supplied waveform WF.

Figure 8:
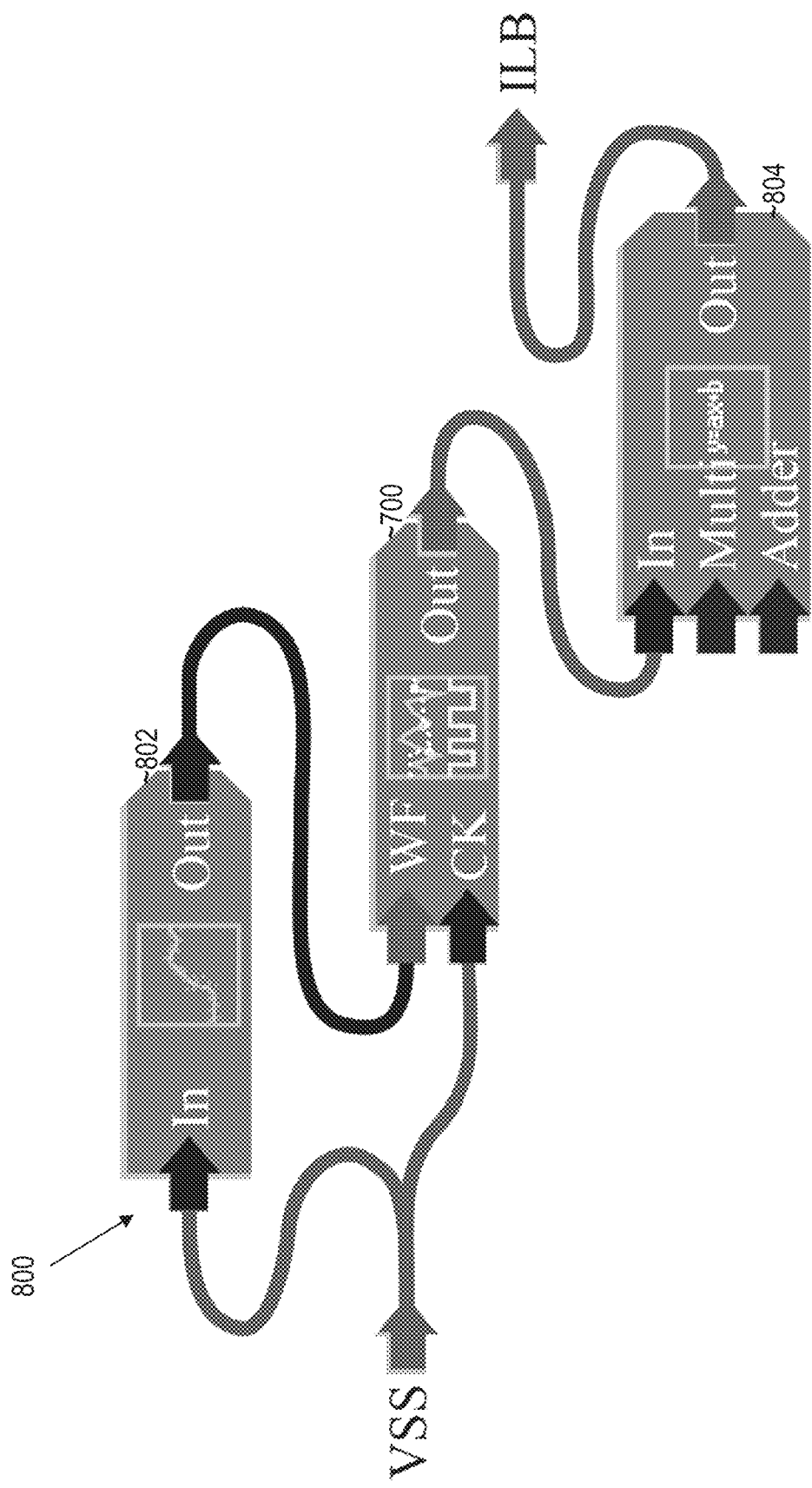
FIG. 8 illustrates an example composite processor for extracting an inductor baseline current, in accordance with one or more embodiments.

Multiple processors in an oscilloscope, including one or more waveform processors, may be connected and configured to form a processing web. As indicated above, a set of digital signal processors in the processing web may be used to extract one or more of the aforementioned performance parameters. For example, FIG. 8 depicts example composite processor 800 for extracting an inductor baseline current. Processor 800 internally comprises three processors: processor 802, waveform processor 700, and processor 804. Processor 802 gates the difference waveform, denoted $V_{ss}$, which may correspond to the over-driven switch voltage. Processor 802 produces a smoothed version of the input waveform and provides this waveform to waveform processor 700. Waveform processor 700 digitally samples the smoothed version of the waveform around the middle to the end of the switch voltage cycle, which is determined from the input clock signal. Waveform processor 700 internally comprises three processors as previously described and outputs a sampled version of the smoothed waveform. Processor 804 applies a gain and offset to the sampled version of the smoothed waveform to produce the baseline inductor current. The gain and offset may vary from system to system and may be determined through calibration.

Figure 9:
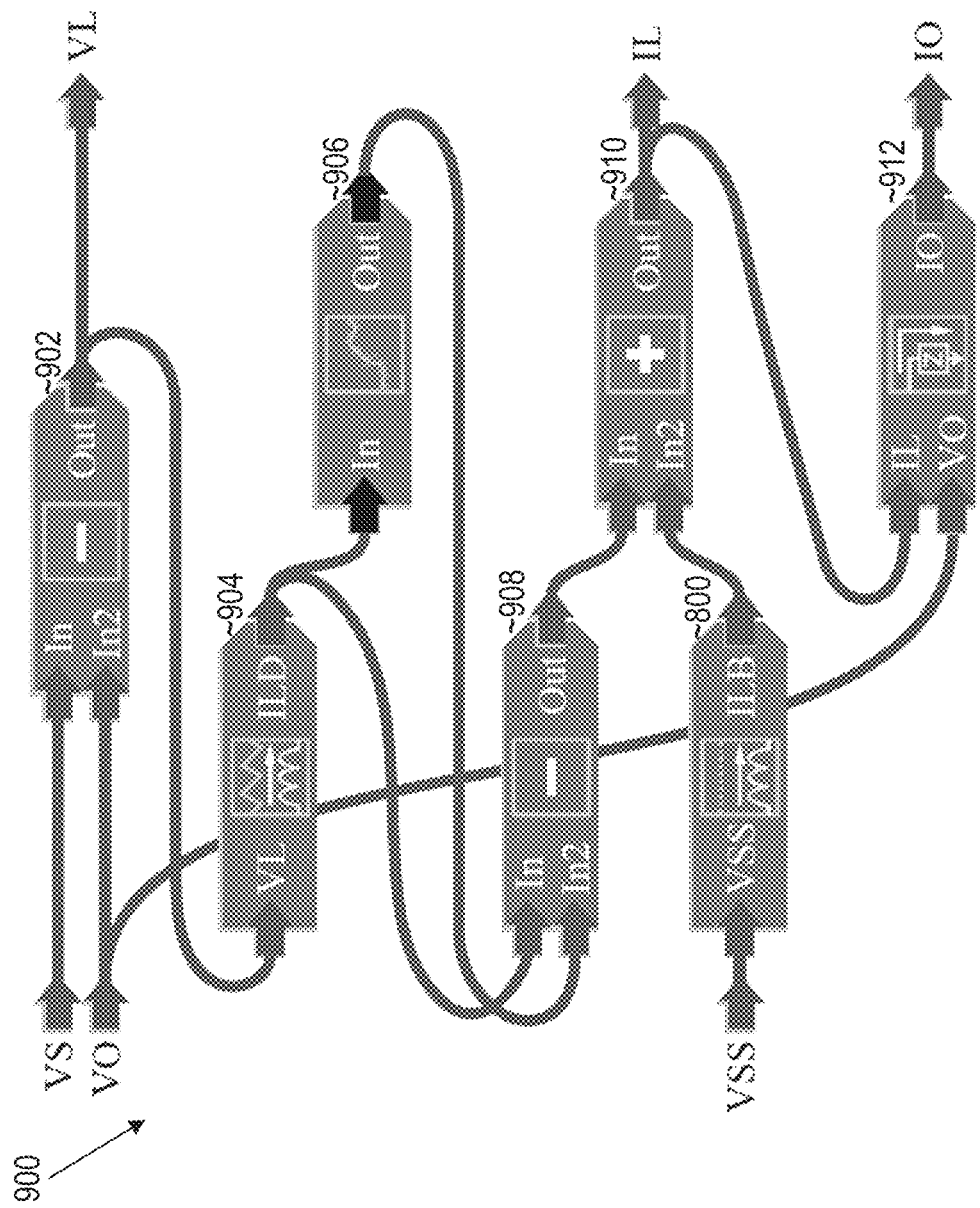
FIG. 9 depicts an example processing web for extracting inductor voltage, inductor current, and output current, in accordance with one or more embodiments.

FIG. 9 depicts example processing web 900 for extracting inductor voltage, inductor current, and output current, in accordance with one or more embodiments. Processing web 900 receives three voltage waveforms:

VS—This input waveform is the measured voltage at the switch, which also corresponds to the voltage at the input to the inductor. This input waveform may be arranged to maximize the vertical scale of a scope without going offscreen (e.g. on the display of the multi-channel oscilloscope).

VO—This input waveform is the measured output voltage for the power conversion circuit, which is also the voltage at the output side of the inductor. This voltage waveform may be arranged such that the waveform does not go offscreen, even under transient conditions. The input waveform may include zero volts.

VSS—This input waveform is the voltage at the switch overdriven into the scope such that the bottom portion of the switch voltage is onscreen where the voltage settles after the overdrive recovery. The top portion of the waveform may be far offscreen.

The output of processing web 900 includes the following three waveforms:

VL—This waveform approximates the voltage across the inductor, formed as a simple subtraction: VL=VS−VO.

IL—This waveform approximates the current through the inductor. This waveform may be generated by computing the dynamic inductor current as previously described and adding the baseline inductor current computed by composite processor 800.

IO—This waveform approximates the output current into the load

Processing web 900 includes the following processors:

Processor 902 computes the difference between VS and VO to obtain the output waveform VL.

Processor 904 generates a waveform approximating the dynamic inductor current, denoted ILD, by applying the difference equation shown in Eq. (13). In cases where $R_L$ is relatively small, processor 904 will perform similar to an integrator on $V_L$. As a result, the output may look like a sawtooth current waveform. Because of integration, the low frequency noise may be highly amplified and the waveform may include low frequency wander. This amplification may be seen by the DC gain $1/R_L$, where $R_L$ tends to be very small.

Processor 906 generates a smoothed version of waveform ILD for purposes of removing wander.

Processor 908 receives the original ILD waveform from processor 904 and the smoothed version from processor 906. Processor 908 removes the wander by subtracting the smoothed waveform from the ILD waveform output. For example, where a sawtooth ILD waveform is provided, the result is the sawtooth current waveform with the wander removed.

Process 800 is supplied with overdriven waveform VSS and produces the per-cycle baseline current ILB as described with reference to FIG. 8.

Processor 910 adds the sawtooth dynamic current, received from processor 908, and the baseline current, received from processor 800, to produce the inductor current waveform IL.

Processor 912 receives waveforms VO and IL and applies the difference equation of Eq. (22) to compute IOUT.

One or more of the output waveforms may be displayed on a screen of an oscilloscope or other computing device. Additionally or alternatively, power waveforms may be output by processing web 900 by taking the product of VO and IO and VS and IL. Thus, processing web 900 may be configured to validate a wide range of performance parameters in the PDN of a DUT.

5. Computing System Overview

According to one embodiment, the techniques described herein are implemented by one or more special-purpose computing devices. The special-purpose computing devices may be hard-wired to perform the techniques, or may include digital electronic devices such as one or more application-specific integrated circuits (ASICs), field programmable gate arrays (FPGAs), or network processing units (NPUs) that are persistently programmed to perform the techniques, or may include one or more general purpose hardware processors programmed to perform the techniques pursuant to program instructions in firmware, memory, other storage, or a combination. Such special-purpose computing devices may also combine custom hard-wired logic, ASICs, FPGAs, or NPUs with custom programming to accomplish the techniques. The special-purpose computing devices may be desktop computer systems, portable computer systems, handheld devices, networking devices or any other device that incorporates hard-wired and/or program logic to implement the techniques.

Figure 10:
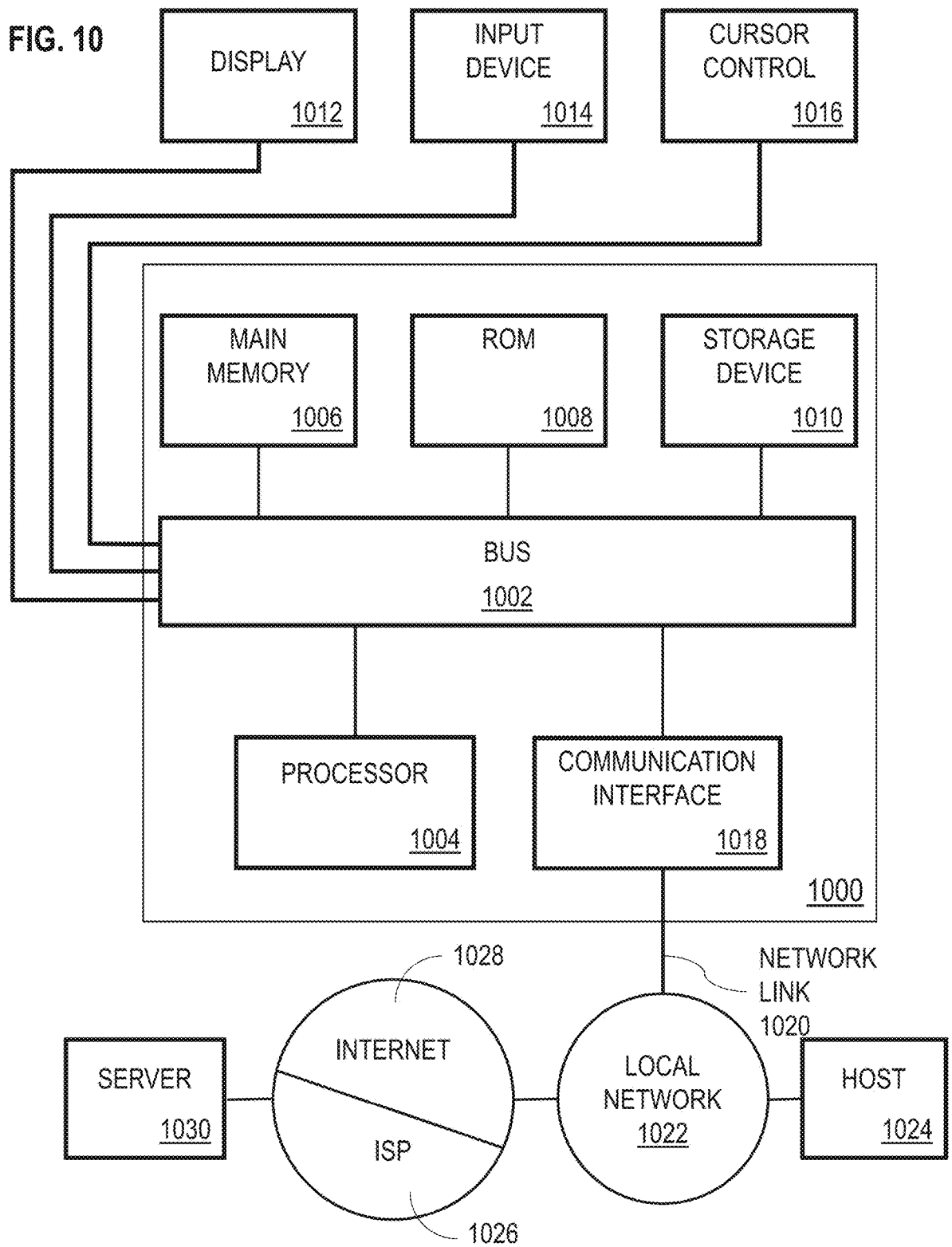
FIG. 10 shows a block diagram that illustrates a computer system in accordance with one or more embodiments.

For example, FIG. 10 is a block diagram that illustrates a computer system 1000 upon which an embodiment of the invention may be implemented. Computer system 1000 includes a bus 1002 or other communication mechanism for communicating information, and a hardware processor 1004 coupled with bus 1002 for processing information. Hardware processor 1004 may be, for example, a general purpose microprocessor.

Computer system 1000 also includes a main memory 1006, such as a random access memory (RAM) or other dynamic storage device, coupled to bus 1002 for storing information and instructions to be executed by processor 1004. Main memory 1006 also may be used for storing temporary variables or other intermediate information during execution of instructions to be executed by processor 1004. Such instructions, when stored in non-transitory storage media accessible to processor 1004, render computer system 1000 into a special-purpose machine that is customized to perform the operations specified in the instructions.

Computer system 1000 further includes a read only memory (ROM) 1008 or other static storage device coupled to bus 1002 for storing static information and instructions for processor 1004. A storage device 1010, such as a magnetic disk or optical disk, is provided and coupled to bus 1002 for storing information and instructions.

Computer system 1000 may be coupled via bus 1002 to a display 1012, such as a cathode ray tube (CRT), for displaying information to a computer user. An input device 1014, including alphanumeric and other keys, is coupled to bus 1002 for communicating information and command selections to processor 1004. Another type of user input device is cursor control 1016, such as a mouse, a trackball, or cursor direction keys for communicating direction information and command selections to processor 1004 and for controlling cursor movement on display 1012. This input device typically has two degrees of freedom in two axes, a first axis (e.g., x) and a second axis (e.g., y), that allows the device to specify positions in a plane.

Computer system 1000 may implement the techniques described herein using customized hard-wired logic, one or more ASICs or FPGAs, firmware and/or program logic which in combination with the computer system causes or programs computer system 1000 to be a special-purpose machine. According to one embodiment, the techniques herein are performed by computer system 1000 in response to processor 1004 executing one or more sequences of one or more instructions contained in main memory 1006. Such instructions may be read into main memory 1006 from another storage medium, such as storage device 1010. Execution of the sequences of instructions contained in main memory 1006 causes processor 1004 to perform the process steps described herein. In alternative embodiments, hard-wired circuitry may be used in place of or in combination with software instructions.

The term "storage media" as used herein refers to any non-transitory media that store data and/or instructions that cause a machine to operate in a specific fashion. Such storage media may comprise non-volatile media and/or volatile media. Non-volatile media includes, for example, optical or magnetic disks, such as storage device 1010. Volatile media includes dynamic memory, such as main memory 1006. Common forms of storage media include, for example, a floppy disk, a flexible disk, hard disk, solid state drive, magnetic tape, or any other magnetic data storage medium, a CD-ROM, any other optical data storage medium, any physical medium with patterns of holes, a RAM, a PROM, and EPROM, a FLASH-EPROM, NVRAM, any other memory chip or cartridge, content-addressable memory (CAM), and ternary content-addressable memory (TCAM).

Storage media is distinct from but may be used in conjunction with transmission media. Transmission media participates in transferring information between storage media. For example, transmission media includes coaxial cables, copper wire and fiber optics, including the wires that comprise bus 1002. Transmission media can also take the form of acoustic or light waves, such as those generated during radio-wave and infra-red data communications.

Various forms of media may be involved in carrying one or more sequences of one or more instructions to processor 1004 for execution. For example, the instructions may initially be carried on a magnetic disk or solid state drive of a remote computer. The remote computer can load the instructions into its dynamic memory and send the instructions over a telephone line using a modem. A modem local to computer system 1000 can receive the data on the telephone line and use an infra-red transmitter to convert the data to an infra-red signal. An infra-red detector can receive the data carried in the infra-red signal and appropriate circuitry can place the data on bus 1002. Bus 1002 carries the data to main memory 1006, from which processor 1004 retrieves and executes the instructions. The instructions received by main memory 1006 may optionally be stored on storage device 1010 either before or after execution by processor 1004.

Computer system 1000 also includes a communication interface 1018 coupled to bus 1002. Communication interface 1018 provides a two-way data communication coupling to a network link 1020 that is connected to a local network 1022. For example, communication interface 1018 may be an integrated services digital network (ISDN) card, cable modem, satellite modem, or a modem to provide a data communication connection to a corresponding type of telephone line. As another example, communication interface 1018 may be a local area network (LAN) card to provide a data communication connection to a compatible LAN. Wireless links may also be implemented. In any such implementation, communication interface 1018 sends and receives electrical, electromagnetic or optical signals that carry digital data streams representing various types of information.

Network link 1020 typically provides data communication through one or more networks to other data devices. For example, network link 1020 may provide a connection through local network 1022 to a host computer 1024 or to data equipment operated by an Internet Service Provider (ISP) 1026. ISP 1026 in turn provides data communication services through the world wide packet data communication network now commonly referred to as the "Internet" 1028. Local network 1022 and Internet 1028 both use electrical, electromagnetic or optical signals that carry digital data streams. The signals through the various networks and the signals on network link 1020 and through communication interface 1018, which carry the digital data to and from computer system 1000, are example forms of transmission media.

Computer system 1000 can send messages and receive data, including program code, through the network(s), network link 1020 and communication interface 1018. In the Internet example, a server 1030 might transmit a requested code for an application program through Internet 1028, ISP 1026, local network 1022 and communication interface 1018.

The received code may be executed by processor 1004 as it is received, and/or stored in storage device 1010, or other non-volatile storage for later execution.

In the foregoing specification, embodiments of the invention have been described with reference to numerous specific details that may vary from implementation to implementation. The specification and drawings are, accordingly, to be regarded in an illustrative rather than a restrictive sense. The sole and exclusive indicator of the scope of the invention, and what is intended by the applicants to be the scope of the invention, is the literal and equivalent scope of the set of claims that issue from this application, in the specific form in which such claims issue, including any subsequent correction.

6. Miscellaneous; Extensions

Embodiments are directed to a system with one or more devices that include a hardware processor and that are configured to perform any of the operations described herein and/or recited in any of the claims below.

In an embodiment, a non-transitory computer readable storage medium comprises instructions which, when executed by one or more hardware processors, causes performance of any of the operations described herein and/or recited in any of the claims.

Any combination of the features and functionalities described herein may be used in accordance with one or more embodiments. In the foregoing specification, embodiments have been described with reference to numerous specific details that may vary from implementation to implementation. The specification and drawings are, accordingly, to be regarded in an illustrative rather than a restrictive sense. The sole and exclusive indicator of the scope of the invention, and what is intended by the applicants to be the scope of the invention, is the literal and equivalent scope of the set of claims that issue from this application, in the specific form in which such claims issue, including any subsequent correction.

What is claimed is:

1. A system comprising:
a multi-channel monitoring device including a first channel for monitoring a switch voltage waveform of a power converter and a second channel for concurrently monitoring an output voltage waveform of the power converter when the power converter is in operation;
a set of processors including a first waveform processor that generates an inductor voltage waveform by subtracting the output voltage waveform from the switch voltage waveform and a second waveform processor for generating, as a function of the inductor voltage waveform, an inductor current waveform approximating current through an inductor of the power converter, wherein the second waveform processor receives the inductor voltage waveform as input from the first waveform processor, and wherein the set of processors causes display of the inductor current waveform.

2. The system of claim 1, wherein the set of processors further generate, as a function of the switch voltage waveform and the output voltage waveform, an output current waveform approximating an output current delivered by the power converter to a load.

3. The system of claim 2, wherein the set of processors includes a third waveform processor that generates the output current waveform; wherein the third waveform processor receives the inductor current waveform as input from the second waveform processor; and wherein the output current waveform is further generated as a function of the inductor current waveform.

4. The system of claim 1, wherein the set of processors includes a third processor that applies a high-pass filter for removing noise from a dynamic inductor current waveform, a fourth processor that determines a baseline current waveform as a function of an overdriven switch voltage, wherein the second waveform processor adds the baseline current waveform to the dynamic inductor current waveform to generate the inductor current waveform approximating the current through the inductor of the power converter.

5. The system of claim 1, wherein the multi-channel monitoring device applies a vertical gain to the first channel and the second channel; wherein a lower vertical gain is applied to first channel than the second channel.

6. The system of claim 1, further comprising an arbitrary waveform generator for injecting signals into a device under test that includes the power converter, wherein the arbitrary waveform generator is configured to change at least one of a phase, frequency, or amplitude of the signals that are injected into the device under test.

7. The system of claim 1, wherein the set of processors generate the inductor current waveform based on digital samples of the switch voltage waveform and the output voltage waveform.

8. The system of claim 7, wherein the inductor current waveform is further generated as a function of a sample period for the digital samples, an inductance value for the inductor, and a resistance value for the inductor.

9. A method comprising:
monitoring, on a first channel of a multi-channel monitoring device a switch voltage waveform of a power converter during operation of the power converter;
monitoring, on a second channel of the multi-channel monitoring device, an output voltage waveform of the power converter during operation of the power converter;
generating, by a first waveform processor, an inductor voltage waveform based at least in part on subtracting the output voltage waveform from the switch voltage waveform;
generating, by a second waveform processor as a function of the inductor voltage waveform, an inductor current waveform approximating current through an inductor of the power converter; and
displaying the inductor current waveform that approximates the current through the inductor of the power converter.

10. The method of claim 9, further comprising generating, as a function of the switch voltage waveform and the output voltage waveform, an output current waveform approximating an output current delivered by the power converter to a load.

11. The method of claim 10, wherein the output current waveform is generated by a third waveform processor; wherein the third waveform processor receives the inductor current waveform as input from the second waveform processor; and wherein the output current waveform is further generated as a function of the inductor current waveform.

12. The method of claim 9, wherein generating the inductor current waveform comprises: applying a high-pass filter to remove noise from a dynamic inductor current waveform, determining a baseline current waveform as a function of an overdriven switch voltage, and adding the baseline current waveform to the dynamic inductor current waveform to generate the inductor current waveform.

13. The method of claim 9, further comprising applying a vertical gain to the first channel and the second channel; wherein a lower vertical gain is applied to first channel than the second channel.

14. The method of claim 9, further comprising injecting, by an arbitrary waveform generator, signals into a device under test that includes the power converter, wherein the arbitrary waveform generator is configured to change at least one of a phase, frequency, or amplitude that of the signals that are injected into the device under test.

15. The method of claim 9, wherein the inductor current waveform is generated based on digital samples of the switch voltage waveform and the output voltage waveform.

16. The method of claim 15, wherein the inductor current waveform is further generated as a function of a sample period for the digital samples, an inductance value for the inductor, and a resistance value for the inductor.

17. A non-transitory computer-readable medium storing instructions, which when executed by one or more hardware processors, cause a computer to perform a method, the method comprising:

monitoring, on a first channel of a multi-channel monitoring device a switch voltage waveform of a power converter during operation of the power converter;

monitoring, on a second channel of the multi-channel monitoring device, an output voltage waveform of the power converter during operation of the power converter;

generating, by a first waveform processor, an inductor voltage waveform based at least in part on subtracting the output voltage waveform from the switch voltage waveform;

generating, by a second waveform processor as a function of the inductor voltage waveform, an inductor current waveform approximating current through an inductor of the power converter; and displaying the inductor current waveform that approximates the current through the inductor of the power converter.

18. The non-transitory computer-readable medium of claim 17, wherein the instructions further cause generating, as a function of the switch voltage waveform and the output voltage waveform, an output current waveform approximating an output current delivered by the power converter to a load.

19. The non-transitory computer-readable medium of claim 18, wherein the output current waveform is generated by a third waveform processor; wherein the third waveform processor receives the inductor current waveform as input from the second waveform processor; and wherein the output current waveform is further generated as a function of the inductor current waveform.

20. The non-transitory computer-readable medium of claim 17, wherein generating the inductor current waveform comprises: applying a high-pass filter to remove noise from a dynamic inductor current waveform, determining a baseline current waveform as a function of an overdriven switch voltage, and adding the baseline current waveform to the dynamic inductor current waveform to generate the inductor current waveform.

* * * * *